United States Patent
Irumata et al.

(10) Patent No.: US 6,986,834 B2
(45) Date of Patent: Jan. 17, 2006

(54) HAFNIUM SILICIDE TARGET AND MANUFACTURING METHOD FOR PREPARATION THEREOF

(75) Inventors: Shuichi Irumata, Ibaraki (JP); Ryo Suzuki, Ibaraki (JP)

(73) Assignee: Nikko Materials Co., Ltd. (JP)

( * ) Notice: Subject to any disclaimer, the term of this patent is extended or adjusted under 35 U.S.C. 154(b) by 96 days.

(21) Appl. No.: 10/487,400

(22) PCT Filed: Jul. 3, 2003

(86) PCT No.: PCT/JP03/08461

§ 371 (c)(1),
(2), (4) Date: Feb. 20, 2004

(87) PCT Pub. No.: WO2004/016825

PCT Pub. Date: Feb. 26, 2004

(65) Prior Publication Data

US 2004/0195094 A1 Oct. 7, 2004

(30) Foreign Application Priority Data

Aug. 6, 2002 (JP) ........................... 2002-228143

(51) Int. Cl.
  *B22F 9/00* (2006.01)

(52) U.S. Cl. ................... 204/192.23; 438/785; 75/245; 204/298.13

(58) Field of Classification Search ............ 204/298.13, 204/192.23; 75/245; 438/785, 287, 682, 104
See application file for complete search history.

(56) References Cited

U.S. PATENT DOCUMENTS

| | | | |
|---|---|---|---|
| 4,619,697 A | 10/1986 | Hijikata et al. ............... 75/230 |
| 5,196,916 A | 3/1993 | Ishigami et al. ............ 257/769 |
| 5,209,835 A * | 5/1993 | Makino et al. ........ 204/192.16 |
| 5,409,517 A | 4/1995 | Satou et al. .................. 75/228 |
| 5,418,071 A | 5/1995 | Satou et al. ................ 428/552 |
| 6,165,413 A * | 12/2000 | Lo et al. ....................... 419/49 |
| 6,291,283 B1 | 9/2001 | Wilk .......................... 438/216 |
| 6,562,207 B1 | 5/2003 | Ivanov .................. 204/298.13 |
| 6,723,183 B2 | 4/2004 | Oda et al. .................... 148/421 |
| 6,759,005 B2 * | 7/2004 | Zhang .......................... 419/11 |
| 2002/0179195 A1 | 12/2002 | Oda et al. ................... 148/421 |
| 2003/0155229 A1 | 8/2003 | Irumata et al. ........ 204/192.23 |

FOREIGN PATENT DOCUMENTS

| | | |
|---|---|---|
| EP | 0442752 A1 | 8/1991 |
| JP | 62072122 A * | 4/1987 |
| WO | WO 01/99176 | 12/2001 |

\* cited by examiner

*Primary Examiner*—Caridad M. Everhart
(74) *Attorney, Agent, or Firm*—Howson and Howson

(57) ABSTRACT

Provided is a hafnium silicide target for forming a gate oxide film composed of $HfSi_{0.82-0.98}$, wherein the oxygen content is 500 to 10000 ppm. Manufactured is a hafnium silicide target for forming a gate oxide film, wherein powder of the composition composed of $HfSi_{0.82-0.98}$ is synthesized, pulverized to be 100 mesh or less, and thereafter subject to hot pressing or hot isostatic pressing (HIP) at 1700° C. to 2120° C. and 150 to 2000 $kgf/cm^2$. Thereby obtained is a hafnium silicide target, and the manufacturing method thereof, suitable for forming a HfSiO film and HfSiON film that may be used as a high dielectric gate insulation film, superior in embrittlement resistance, having a low generation of particles, and which is not likely to cause ignition of sintering powder or explosion of powder dust during the manufacturing process thereof.

9 Claims, No Drawings

HAFNIUM SILICIDE TARGET AND MANUFACTURING METHOD FOR PREPARATION THEREOF

FIELD OF THE INVENTION

The present invention relates to a hafnium silicide target having a low generation of particles, and suitable for forming a HfSiO film and HfSiON film that may be used as a high dielectric gate insulation film, and to the manufacturing method of a target which is not likely to cause ignition of sintering powder or explosion of powder dust during the manufacturing process thereof. Moreover, the unit of "ppm" as used in this description shall mean wtppm in all cases.

BACKGROUND OF THE INVENTION

The film thickness of a dielectric gate insulation film largely influences the performance of a MOS transistor, and it is essential that the interface with the silicon substrate is electrically smooth and that the mobility of the carrier does not deteriorate.

Conventionally, a $SiO_2$ film has been used as this gate insulation film, and was the most superior in terms of interfacial quality. In addition, there is a characteristic in that the thinner the $SiO_2$ film used as this gate insulation film, the number of carriers (that is, electrons or electron holes) increases, and the drain current also increases thereby.

From the foregoing circumstances, each time the power supply voltage would decrease as a result of miniaturizing the wiring, the gate $SiO_2$ film has been consistently formed as thin as possible within a range that would not deteriorate the reliability of dielectric breakdown. Nevertheless, a tunnel leakage current flows directly when the gate $SiO_2$ film is formed of a thickness of 3 nm or less, and a problem arises in that this film would not function as an insulation film.

Meanwhile, although attempts are being made to miniaturize the transistor, so as long as there are limitations in the film thickness of the $SiO_2$ film, which is the gate insulation film as described above, miniaturization of the transistor loses its significance, and a problem arises in that the performance is not improved.

Moreover, in order to lower the power supply voltage of the LSI as well as lower the power consumption, it is necessary to make the gate insulation film even thinner. Nevertheless, since there is a problem regarding the gate dielectric breakdown when the film thickness of the $SiO_2$ film is made 3 nm or less as described above, thinning of the film had a limitation in itself.

In light of the foregoing circumstances, a gate insulation film with high dielectric constant is being considered lately as a substitute for the $SiO_2$ film. And, the HfSiO film and HfSiON film are attracting attention as this type of high dielectric gate insulation film.

This gate insulation film is capable of acquiring, with a comparatively thick film, a capacity equivalent to the $SiO_2$ film, and is characterized in that it is able to suppress the tunnel current. Further, since this can be deemed as a film in which Hf is added to a $SiO_2$ film or SiON film, interfacial quality similar to that of $SiO_2$ can be expected.

Thus, sought is a sputtering target capable of easily and stably forming a high-grade HfSiO and HfSiON gate insulation film with high dielectric constant.

Meanwhile, since high purity hafnium silicide powder is extremely oxidative, dangers of the ignition of sintering powder or explosion of powder dust during the manufacturing process of a hafnium silicide target via sintering are becoming a problem, and sought is a manufacturing method of a target which is not likely to cause ignition of sintering powder or explosion of powder dust during the manufacturing process thereof.

SUMMARY OF THE INVENTION

In order to overcome the foregoing problems, the present invention aims to provide a hafnium silicide target superior in workability and embrittlement resistance, which is not likely to cause ignition of sintering powder or explosion of powder dust, and which is suitable for forming a HfSiO film and HfSiON film that may be used as a high dielectric gate insulation film in substitute for a $SiO_2$ film, and the manufacturing method thereof.

The present invention provides:

1. A hafnium silicide target for forming a gate oxide film composed of $HfSi_{0.82-0.98}$, wherein the oxygen content is 500 to 10000 ppm;
2. A hafnium silicide target for forming a gate oxide film according to paragraph 1 above, wherein the relative density is 95% or more;
3. A hafnium silicide target for forming a gate oxide film according to paragraph 1 or paragraph 2 above, wherein the zirconium content is 2.5 wt % or less;
4. A hafnium silicide target for forming a gate oxide film according to any one of paragraphs 1 to 3 above, wherein the impurities are C: 300 ppm or less, Ti: 100 ppm or less, Mo: 100 ppm or less, W: 10 ppm or less, Nb: 10 ppm or less, Fe: 10 ppm or less, Ni: 10 ppm or less, Cr: 10 ppm or less, Na: 0.1 ppm or less, K: 0.1 ppm or less, U: 0.01 ppm or less, and Th: 0.01 ppm or less;
5. A hafnium silicide target for forming a gate oxide film according to any one of paragraphs 1 to 4 above, wherein the average grain size is 5 to 200 $\mu m$;
6. A manufacturing method of a hafnium silicide target for forming a gate oxide film, wherein powder of the composition composed of $HfSi_{0.82-0.98}$ is synthesized, pulverized to be 100 mesh or less, and thereafter subject to hot pressing or hot isostatic pressing (HIP) at 1700° C. to 2120° C. and 150 to 2000 $kgf/cm^2$; and
7. A manufacturing method of a hafnium silicide target for forming a gate oxide film according to any one of paragraphs 1 to 5 above, wherein powder of the composition composed of $HfSi_{0.82-0.98}$ is synthesized, pulverized to be 100 mesh or less, and thereafter subject to hot pressing or hot isostatic pressing (HIP) at 1700° C. to 2120° C. and 150 to 2000 $kgf/cm^2$.

DETAILED DESCRIPTION OF THE INVENTION

A high dielectric gate insulation film comprising the quality as a substitute for the $SiO_2$ film is formed by performing oxygen reactive sputtering to a HfSi target. This oxide film is considered to be a hybridization of an oxide film as represented with $HfO_2.SiO_2$, and a target was usually demanded of a composition of Si/Hf=1.0.

Generally, although the composition ratio of Hf and Si is demanded to be a composition ratio close to the target film, a Hf-rich oxide film tends to have a high dielectric constant, a Si-rich oxide film has favorable compatibility with a Si substrate and can easily become an amorphous structure, and therefore possesses a characteristic of having a low leak current.

In light of the above, it is necessary to consider and determine the balance of the dielectric constant and leak current in accordance with the purpose of use. Moreover, each manufacturing process of a device is demanded of unique compatibility, and a material capable of arbitrarily changing the composition ratio of Hf and Si as necessary is in demand.

During sintering the mixed powder of hafnium and silicon, silicide phases such as a HfSi phase and $HfSi_2$ phase, and mixed crystals such as a Hf phase and Si phase are formed in accordance with the composition ratio, but generally speaking, there is a problem in that these hafnium silicide inter compounds are not able to obtain sufficient density increase during the sintering since they have a high melting point, become a sintered body of a porous texture, and thereafter become a target with numerous generation of particles.

And, unless adjusting the hot pressing conditions; that is, the heating temperature and pressure in accordance with the composition ratio, a target of an optimum density cannot be obtained.

Upon persevering to improve the increase in density, the present invention succeeded in obtaining a target suitable as a hafnium silicide target for forming a gate oxide film.

The present invention provides a hafnium silicide target for forming a gate oxide film composed of $HfSi_{0.82-0.98}$ in consideration of the balance between the dielectric constant and leak current. Thereby obtained is a hafnium silicide target capable of eliminating the porous structure, and which has a relative density of 95% or more.

When the relative density becomes less than 95%, the brittleness deteriorates due to the lack of density, and the workability also deteriorates thereby. This also generates the increase of particles caused by the fracture and scattering of fragile crystals. It is therefore preferable that the relative density be within the foregoing range.

Meanwhile, a significant problem arose during the manufacturing process of the hafnium silicide target for forming a gate oxide film. Specifically, since the high-purity hafnium silicide powder is extremely oxidative, ignition of sintering powder or explosion of powder dust would occur during the process of pulverization or sieving. Thus, it has been anticipated that such ignition of sintering power and explosion powder dust could be prevented upon providing an oxide film to the surface of the powder.

This surface oxide film may be sufficiently dissolved in HfSi during the subsequent hot pressing process so as long as it is provided in a suitable amount; that is, so as long as it is not provided excessively.

Nevertheless, when the oxide film is provided in large amounts, there is a problem in that the insulating material of HfO or HfSiO within the hafnium silicide target will remain even after hot pressing, and this will be exposed as nodules (protrusions) upon performing DC magnetron sputtering widely employed in the manufacture of semiconductor devices, and abnormal discharge (arcing) will occur beginning at such portion. This kind of abnormal discharge will dissolve the peripheral HfSi portion, and a portion thereof will become clusters and form defects (particles) on the wafer, and generate defective goods and deteriorate the production yield.

In light of the problems described above, the present invention provides a method for actively introducing oxygen in the hafnium silicide powder, while suppressing the generation of particles, and a target used therefor.

In consideration of the above, the present inventors have discovered that it is extremely effect to make the oxygen content within the hafnium silicide target be 500 to 10000 ppm such that, while preventing the generation of particles, dangers relating to the ignition or explosion of hafnium silicide powder during the manufacturing process can be suppressed.

This specification and management of the oxygen content is extremely important. In other words, when the oxygen content is less than 500 ppm, there is a possibility that the target will ignite or explode during the manufacture thereof, and, contrarily, when the oxygen content exceeds 10000 ppm, oxygen within the target will exist as an oxide and cause abnormal discharge during the sputtering, particles will increase thereby, and the production yield rate will decrease as a result thereof.

Further, it is preferable that the zirconium content within the target be controlled to 2.5 wt % or less. When the amount of zirconium exceeds 2.5 wt %, process conditions such as voltage, current and substrate temperature during the reactive sputtering for forming the oxide film will vary greatly, and this is not preferable.

Moreover, it is preferable that impurities within the hafnium silicide target for forming the gate oxide film are C: 300 ppm or less, Ti: 100 ppm or less, Mo: 100 ppm or less, W: 10 ppm or less, Nb: 10 ppm or less, Fe: 10 ppm or less, Ni: 10 ppm or less, Cr: 10 ppm or less, Na: 0.1 ppm or less, K: 0.1 ppm or less, U: 0.01 ppm or less, and Th: 0.01 ppm or less. This is because these impurities will become the contamination source to the gate electrode and lower Si substrate.

In order to manufacture a hafnium silicide target for forming a gate oxide film superior in embrittlement resistance composed of $HfSi_{0.82-0.98}$, powder of the composition composed of $HfSi_{0.82-0.98}$ is synthesized, thereafter pulverized and sieved, and then subject to hot pressing or hot isostatic pressing (HIP) at 1700° C. to 2120° C.

With the powder of the composition composed of $HfSi_{0.82-0.98}$ according to the present invention, if the temperature is less than 1700° C. the density will be insufficient, and if the temperature exceeds 2120° C., this is not preferable since partial dissolution will begin to occur.

Generally, with the HfSi within the compositional range of HfSix, x=0.80, a liquid phase begins to appear at 2320 (±15)° C. or higher, and the density will not increase unless hot pressing is performed in the vicinity of this temperature. Meanwhile, with the HfSi within the compositional range of HfSix, x=1.0, since the liquid phase begins to appear at 2142 (±15)° C. or higher, the density can be increased by performing hot pressing in the vicinity of this temperature.

With the HfSi within the compositional range of HfSix, x=0.8–1.0, the density can be increased by performed hot press molding at a temperature that is 30–500° C. lower than 2142 (±15)° C. and by filled the gap of $HfSi_{0.8}$ that does not deform easily with the easily deformable $HfSi_{1.0}$.

When HfSix, x<0.82, the density will not increase even when hot pressing is performed since there is not much $HfSi_{1.0}$ for filling the gap.

When HfSix, x>0.98, and there is a local $HfSi_{2.0}$ portion, since the temperature in which the liquid phase of $HfSi_{2.0}$ will appear becomes 1543 (±8)° C., a part thereof will melt and burn onto the hot pressing die. In order to avoid this, considered may be lowering the hot pressing temperature to be less than 1543(±8)° C., but this will not be able to sufficiently increase the density.

As described above, by avoiding an intermetallic compound ($HfSi_{0.8}$, $HfSi_{1.0}$) having a considerable difference in the melting temperature at the high side and low side, or avoiding compositions in the vicinity thereof; that is, by employing powder of a composition composed from $HfSi_{0.82-0.98}$, high densification is enabled, and a target producing few particles can be manufactured thereby.

Upon synthesizing the powder of a composition composed from $HfSi_{0.82-0.98}$, for instance, $HfH_2$ powder (under 100 mesh) and Si powder (under 100 mesh) are prepared and mixed to become a molar ratio of 1:0.82 to 1:0.98 at a hafnium and silicon ratio, and thereafter heated to roughly 800° C. (600° C. to 800° C.) for synthesizing. Here, it is also possible to add pre-synthesized powder.

Hf powder is extremely oxidative, and has a problem in that it may ignite when pulverized. Thus, it is not preferable to use Hf powder by itself. In light of the above, hafnium hydride may be used for preventing this kind of ignition.

And, this hafnium hydride powder and silicon powder are mixed and heated in a vacuum to synthesize a hafnium silicide target. Dehydrogenation begins to occur from around 600° C. The oxygen content of the synthesized silicide powder mass can be adjusted by adjusting the oxygen content of the silicon powder upon forming silicide.

This hafnium silicide alloy mass is pulverized with the likes of a ball mill under an atmosphere in which pure water is added thereto. As a result, sintering powder for hafnium silicide having a total oxygen content of 500 to 10000 ppm can be obtained.

With the formation of silicide, since sintering is performed at a low temperature as described above, it yields a significant characteristic in being able to suppress the growth of crystal grains. Upon heating and synthesizing, as a result of performing dehydrogenation and forming silicide at a low temperature, crystal grain growth can be suppressed, the primary grains in the sintering powder will remain fine, and high densification is enabled during the molding process.

When the sintering powder becomes coarse, pulverization prior to sintering will become difficult, and this will cause the remanence of coarse grains and deterioration of density. As described above, since the grain growth can be suppressed by performing sintering at a low temperature, the average crystal grain size of the target can be made to be 5 to 200 $\mu$m. High densification is also enabled during sintering.

With a target having an average grain size of less than 5 $\mu$m, it is difficult to make the amount of oxygen 10000 ppm or less, and there is fear of ignition during the manufacturing process. Moreover, when the average grain size exceeds 200 $\mu$m, since particles will increase and the production yield rate will deteriorate, it is desirable that the average grain size be set between 5 and 200 $\mu$m as described above.

High densification during sintering is enabled through the synthesis of the powder composition composed from the foregoing $HfSi_{0.82-0.98}$ and performing hot pressing or hot isostatic pressing (HIP) at 1700° C. to 2120° C.

The foregoing hot pressing or hot isostatic pressing (HIP) temperature is a temperature immediately under the liquid phase generation of the synthesized powder, and this temperature range is important for the sintering. This enables the realization of a high density hafnium silicide target having a relative density of 95% or more.

The high density hafnium silicide target of the present invention yields an effect in preventing the generation of particles caused by the pores during sputtering.

EXAMPLES

Next, the Examples are explained. Further, these Examples are merely illustrative, and the present invention shall in no way be limited thereby. In other words, the present invention shall include all other modes or modifications other than these Examples within the scope of the technical spirit of this invention.

Example 1

A synthesized mass of $HfSi_{0.95}$ was obtained by mixing $HfH_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

This synthesized mass was pulverized with a ball mill in the atmosphere, the ball and pulverized powder were separated, and left standing for 24 hours under a temperature of 20° C. and humidity of 70%. Upon measurement, the oxygen content was 550 ppm.

A sintered body having a density of 99.9% was obtained by hot pressing this silicide powder under the condition of 300 kgf/cm$^2$×2 hours at 2000° C. This was further machine processed to prepare a target of $\phi$300 mm×6.35 mmt. Texture with hardly any pores was obtained thereby.

Sputtering was performed with the target prepared as described above, and, upon measuring the particles on an 8-inch wafer, only a total of 5 particles/8-inch wafer having a measurement of 0.2 $\mu$m or larger were found, and the generation of particles decreased considerably. A hafnium silicide target producing few particles during sputtering was obtained as a result of the above. Further, the manufacturing process could be carried out safely since the ignition or explosion during the manufacturing process of the foregoing target did not occur.

Example 2

A synthesized mass of $HfSi_{0.95}$ was obtained by mixing $HfH_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

0.1% of pure water by weight of this HfSi powder was added to this synthesized mass in the atmosphere, this was pulverized with a ball mill, the ball and pulverized powder were separated, and, upon measurement, the oxygen content was 2100 ppm.

A sintered body having a density of 99.8% was obtained by hot pressing this silicide powder under the condition of 300 kgf/cm$^2$×2 hours at 2000° C. This was further machine processed to prepare a target of $\phi$300 mm×6.35 mmt.

Sputtering was performed with the target prepared as described above, and, upon measuring the particles on an 8-inch wafer, only a total of 5 particles/8-inch wafer having a measurement of 0.2 $\mu$m or larger were found, and the generation of particles decreased considerably.

A hafnium silicide target producing few particles during sputtering was obtained as a result of the above. Further, the manufacturing process could be carried out safely since the ignition or explosion during the manufacturing process of the foregoing target did not occur.

Example 3

A synthesized mass of $HfSi_{0.95}$ was obtained by mixing $HfH_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

1% of pure water by weight of this HfSi powder was added to this synthesized mass in the atmosphere, this was pulverized with a ball mill, the ball and pulverized powder were separated, and, upon measurement, the oxygen content was 2000 ppm.

A sintered body having a density of 99.8% was obtained by hot pressing this silicide powder under the condition of 300 kgf/cm$^2$×2 hours at 2000° C.

Next, this was further machine processed to prepare a target of φ300 mm×6.35 mmt. Sputtering was performed with the target prepared as described above, and, upon measuring the particles on an 8-inch wafer, only a total of 10 particles/8-inch wafer having a measurement of 0.2 μm or larger were found, and the generation of particles decreased considerably.

A hafnium silicide target producing few particles during sputtering was obtained as a result of the above. Further, the manufacturing process could be carried out safely since the ignition or explosion during the manufacturing process of the foregoing target did not occur.

Comparative Example 1

A synthesized mass of HfSi$_{0.95}$ was obtained by mixing HfH$_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

This synthesized mass was pulverized in a ball mill substituted with Ar, and the ball and pulverized powder were separated thereafter, but the pulverized powder ignited during the separation.

Comparative Example 2

A synthesized mass of HfSi$_{0.95}$ was obtained by mixing HfH$_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

This synthesized mass was pulverized in a ball mill in the atmosphere, and the ball and pulverized powder were separated thereafter. Upon measurement, the oxygen content was 450 ppm. While sieving this powder with a 50-mesh sieve, the sieved HfSi powder scorched.

Comparative Example 3

A synthesized mass of HfSi$_{0.95}$ was obtained by mixing HfH$_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

1% of pure water by weight of this HfSi powder was added to this synthesized mass in the atmosphere, this was pulverized with a ball mill, the ball and pulverized powder were separated, and left standing for 24 hours at a temperature of 50° C. and humidity of 80%. Upon measurement, the oxygen content was 11000 ppm.

A sintered body having a density of 99.3% was obtained by hot pressing this silicide powder under the condition of 300 kgf/cm$^2$×2 hours at 2000° C.

Next, this was further machine processed to prepare a target of φ300 mm×6.35 mmt. Sputtering was performed with the target prepared as described above, and, upon measuring the particles on an 8-inch wafer, a total of 150 particles/8-inch wafer having a measurement of 0.2 μm or larger were found, and the generation of particles increased considerably. Nevertheless, ignition or explosion during the manufacturing process of the target did not occur.

Comparative Example 4

A synthesized mass of HfSi$_{0.95}$ was obtained by mixing HfH$_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

1% of pure water by weight of this HfSi powder was added to this synthesized mass in the atmosphere, this was pulverized with a ball mill, the ball and pulverized powder were separated, and left standing for 24 hours at a temperature of 100° C. and humidity of 90%. Upon measurement, the oxygen content was 17000 ppm.

A sintered body having a density of 98.7% was obtained by hot pressing this silicide powder under the condition of 300 kgf/cm$^2$×2 hours at 2000° C.

Next, this was further machine processed to prepare a target of φ300 mm×6.35 mmt. Sputtering was performed with the target prepared as described above, and, upon measuring the particles on an 8-inch wafer, a total of 360 particles/8-inch wafer having a measurement of 0.2 μm or larger were found, and the generation of particles increased considerably. Nevertheless, ignition or explosion during the manufacturing process of the target did not occur.

Example 4

A synthesized mass of HfSi$_{0.83}$ was obtained by mixing HfH$_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

0.1% of pure water by weight of this HfSi powder was added to this synthesized mass in the atmosphere, this was pulverized with a ball mill, the ball and pulverized powder were separated, and, upon measurement, the oxygen content was 2500 ppm.

A sintered body having a density of 98.4% was obtained by hot pressing this silicide powder under the condition of 300 kgf/cm$^2$×2 hours at 2000° C. This was further machine processed to prepare a target of φ300 mm×6.35 mmt.

Sputtering was performed with the target prepared as described above, and, upon measuring the particles on an 8-inch wafer, only a total of 20 particles/8-inch wafer having a measurement of 0.2 μm or larger were found, and the generation of particles decreased considerably.

A hafnium silicide target producing few particles during sputtering was obtained as a result of the above. Further, the manufacturing process could be carried out safely since the ignition or explosion during the manufacturing process of the foregoing target did not occur.

Example 5

A synthesized mass of HfSi$_{0.98}$ was obtained by mixing HfH$_2$ powder under 100 mesh and Si powder under 100 mesh and heating this at 800° C., in a vacuum, whereby dehydrogenation reaction and silicide synthetic reaction were performed. Upon analysis, the oxygen content of this synthesized mass was 300 ppm.

0.1% of pure water by weight of this HfSi powder was added to this synthesized mass in the atmosphere, this was pulverized with a ball mill, the ball and pulverized powder were separated, and, upon measurement, the oxygen content was 2000 ppm.

A sintered body having a density of 99.7% was obtained by hot pressing this silicide powder under the condition of 300 kgf/cm$^2$×2 hours at 2000° C. This was further machine processed to prepare a target of ϕ300 mm×6.35 mmt.

Sputtering was performed with the target prepared as described above, and, upon measuring the particles on an 8-inch wafer, only a total of 7 particles/8-inch wafer having a measurement of 0.2 μm or larger were found, and the generation of particles decreased considerably.

A hafnium silicide target producing few particles during sputtering was obtained as a result of the above. Further, the manufacturing process could be carried out safely since the ignition or explosion during the manufacturing process of the foregoing target did not occur.

Comparative Example 5

A synthesized mass of HfSi$_{0.81}$ was obtained by mixing HfH$_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

0.1% of pure water by weight of this HfSi powder was added to this synthesized mass in the atmosphere, this was pulverized with a ball mill, the ball and pulverized powder were separated, and, upon measurement, the oxygen content was 2000 ppm.

A sintered body having a density of 94.5% was obtained by hot pressing this silicide powder under the condition of 300 kgf/cm$^2$×2 hours at 2000° C. This was further machine processed to prepare a target of ϕ300 mm×6.35 mmt.

Sputtering was performed with the target prepared as described above, and, upon measuring the particles on an 8-inch wafer, a total of 120 particles/8-inch wafer having a measurement of 0.2 μm or larger were found, and the generation of particles increased considerably.

Nevertheless, ignition or explosion during the manufacturing process of the target did not occur.

Comparative Example 6

A synthesized mass of HfSi$_{0.99}$ was obtained by mixing HfH$_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

0.1% of pure water by weight of this HfSi powder was added to this synthesized mass in the atmosphere, this was pulverized with a ball mill, the ball and pulverized powder were separated, and, upon measurement, the oxygen content was 1800 ppm.

A sintered body having a density of 96.3% was obtained by hot pressing this silicide powder under the condition of 300 kgf/cm$^2$×2 hours at 2000° C. This was further machine processed attempting to prepare a target of ϕ300 mm×6.35 mmt.

Nevertheless, this burned onto the dice, and cracked upon removal from the dice. Thus, it could not be processed into a target.

Comparative Example 7

A synthesized mass of HfSi$_{0.99}$ was obtained by mixing HfH$_2$ powder under 100 mesh and Si powder under 100 mesh and heating this at 800° C. in a vacuum, whereby dehydrogenation reaction and silicide synthetic reaction were performed. Upon analysis, the oxygen content of this synthesized mass was 300 ppm.

0.1% of pure water by weight of this HfSi powder was added to this synthesized mass in the atmosphere, this was pulverized with a ball mill, the ball and pulverized powder were separated, and, upon measurement, the oxygen content was 2600 ppm.

A sintered body having a density of 85.9% was obtained by hot pressing this silicide powder under the condition of 300 kgf/cm$^2$×2 hours at 1500° C. This was further machine processed to prepare a target of ϕ300 mm×6.35 mmt.

Sputtering was performed with the target prepared as described above, and, upon measuring the particles on an 8-inch wafer, a total of 350 particles/8-inch wafer having a measurement of 0.2 μm or larger were found, and the generation of particles increased considerably.

Nevertheless, ignition or explosion during the manufacturing process of the target did not occur.

Results of the foregoing Examples and Comparative Examples are shown in Table 1. As shown in Table 1, the relative density of the targets in Examples 1 to 3 is all 95% or higher. Further, the number of particles was 20 or less. And the relative density could be improved under the optimum hot pressing conditions at 1700° C. to 2120° C.

As described above, it has been confirmed that a hafnium silicide target in which the Hf:Si ratio is 1:0.82 to 0.98 can be stably manufactured under the foregoing conditions while improving the density of the sintered body.

Contrarily, with Comparative Example 1 and Comparative Example 2, the silicide hafnium sintering powder either ignited or scorched during the manufacturing process, and it was difficult to manufacture a target. This is because the oxygen content was less than 500 ppm.

Meanwhile, if the oxygen content is excessive and exceeds 10000 ppm, as shown in Comparative Examples 3 and 4, the generation of particles increased, and the quality of the target deteriorated. This is because an insulating material such as the HfO or HfSiO was formed within the hafnium silicide target, became exposed during sputtering, caused arcing beginning at such portion, whereby particles were increased.

With Comparative Example 5, since the Si molar ratio is smaller (x=0.81) than that of the present invention, sintering was insufficient, and the relative density became less than 95%, and the number of particles also increased. With Comparative Example 6, since the Si molar ratio is greater (x=0.99) than that of the present invention, burning occurred, the target cracked thereby, and it was not possible to manufacture the target.

Thus, with Comparative Example 7 Where the sintering temperature was lowered, the generation of particles increased since the sintering temperature did not rise.

Accordingly, superiority of the Examples according to the present invention is evident, and it is further clear that the present invention possesses superior characteristics.

TABLE 1

| | Si Molar Ratio | HP Temperature °C. | Target Oxygen Content | Density Ratio % | Number of Particles | Accidents such as Ignition and Cracks |
|---|---|---|---|---|---|---|
| Example 1 | 0.95 | 2000 | 550 | 99.9 | 5 | None |
| Example 2 | 0.95 | 2000 | 2100 | 99.8 | 5 | None |
| Example 3 | 0.95 | 2000 | 2000 | 99.2 | 10 | None |
| Example 4 | 0.83 | 2000 | 2500 | 98.4 | 20 | None |
| Example 5 | 0.98 | 2000 | 3000 | 99.7 | 7 | None |
| Comparative Example 1 | 0.95 | — | 300 | — | — | Ignition of Powder |
| Comparative Example 2 | 0.95 | — | 450 | — | — | Scorching of Powder |
| Comparative Example 3 | 0.95 | 2000 | 11000 | 99.3 | 150 | None |
| Comparative Example 4 | 0.95 | 2000 | 17000 | 98.7 | 360 | None |
| Comparative Example 5 | 0.81 | 2000 | 2100 | 94.5 | 120 | None |
| Comparative Example 6 | 0.99 | 2000 | 1800 | 96.3 | — | Cracks |
| Comparative Example 7 | 0.99 | 1500 | 2600 | 85.9 | 350 | None |

Target Oxygen Content: ppm
Number of Particles: Particles/8-Inch Wafer
Accidents such as Ignition and Cracks: Ignition, scorching and explosion of powder, cracks in target during manufacturing process The present invention is characterized in that it is able to obtain a hafnium silicide target superior in workability and embrittlement resistance, and suitable for forming a HfSiO film and HfSiON film that may be used as a high dielectric gate insulation film in substitute for a $SiO_2$ film.

The present hafnium silicide target has a relative density of 95% or more and is of high density, and possesses superior strength. Moreover, the highly densified silicide target of the present invention is capable of preventing the generation of particles arising from nodules during the sputtering and the generation of particles resulting from the fracture and scattering of brittle textures, and yields a significant advantage in that the sintering powder is not likely to ignite, scorch or explode during the processing or manufacturing process of the target, and destruction of the target can be avoided thereby.

What is claimed is:

1. A method of manufacturing a hafnium silicide target for forming a gate oxide film, comprising the steps of: synthesizing a powder of a composition composed of $HfSi_{0.82-0.98}$ pulverizing said powder to be 100 mesh or less, and after said pulverizing and synthesizing steps, subjecting said powder to hot pressing or hot isostatic pressing (HIP) at 1700° C. to 2120° C. and 150 to 2000 kgf/cm².

2. A hafnium silicide target for forming a gate oxide film, said hafnium silicide target being composed of $HfSi_{0.82-0.98}$ having an oxygen content of 500 to 10000 ppm, and being manufactured by a process in which a powder of a composition composed of $HfSi_{0.82-0.98}$ is synthesized, pulverized to be 100 mesh or less, and thereafter is subjected to hot pressing or hot isostatic pressing (HIP) at 1700° C. to 2120° C. and 150 to 2000 kgf/cm².

3. A hafnium silicide target far forming a gate oxide film according to claim 2, wherein said hafnium silicide target has a zirconium content of 2.5 wt % or less.

4. A hafnium silicide target for forming a gate oxide film according to claim 2, wherein impurities of said hafnium silicide target include C: 300 ppm or less, Ti: 100 ppm or less, Mo: 100 ppm or less, W: 10 ppm or less, Nb: 10 ppm or less, Fe: 10 ppm or less, Ni: 10 ppm or less, Cr: 10 ppm or less, Na: 0.1 ppm or less, K: 0.1 ppm or less, U: 0.01 ppm or less, and Th: 0.01 ppm or less.

5. A hafnium silicide target for forming a gate oxide film according to claim 2, wherein said hafnium silicide target has an average grain size of 5 to 200 µm.

6. A hafnium silicide target for forming a gaze oxide film according to claim 2, wherein said hafnium silicide target has a relative density of 95% or more.

7. A hafnium silicide target for forming a gate oxide film according to claim 6, wherein said hafnium silicide target has a zirconium content of 2.5 wt % or less.

8. A hafnium silicide target for forming a gate oxide film according to claim 7, wherein impurities of said hafnium silicide target include C: 300 ppm or less, Ti: 100 ppm or less, Mo: 100 ppm or less, W: 10 ppm or less, Nb: 10 ppm or less, Fe: 10 ppm or less, Ni: 10 ppm or less, Cr: 10 ppm or less, Na: 0.1 ppm or less, K: 0.1 ppm or less, U: 0.01 ppm or less, and Th: 0.01 ppm or less.

9. A hafnium silicide target for forming a gate oxide film according to claim 8, wherein said hafnium silicide target has an average grain size of 5 to 200 µm.

* * * * *

UNITED STATES PATENT AND TRADEMARK OFFICE
CERTIFICATE OF CORRECTION

PATENT NO. : 6,986,834 B2 Page 1 of 1
DATED : January 17, 2006
INVENTOR(S) : Irumata et al.

It is certified that error appears in the above-identified patent and that said Letters Patent is hereby corrected as shown below:

<u>Column 12,</u>
Line 28, "target far forming" should read -- target for forming --.
Line 41, "forming a gaze oxide" should read -- forming a gate oxide --.

Signed and Sealed this

Fourth Day of April, 2006

JON W. DUDAS
*Director of the United States Patent and Trademark Office*